United States Patent [19]
Kaneko

[11] Patent Number: 5,254,278
[45] Date of Patent: Oct. 19, 1993

[54] LEAD TITANATE BASED PIEZOELECTRIC CERAMIC MATERIAL

[75] Inventor: Kazuhide Kaneko, Susono, Japan

[73] Assignee: Toyota Jidosha Kabushiki Kaisha, Japan

[21] Appl. No.: 883,956

[22] Filed: May 15, 1992

[30] Foreign Application Priority Data

May 16, 1991 [JP] Japan .................. 3-111535

[51] Int. Cl.$^5$ .............................. C04B 35/46
[52] U.S. Cl. .................... 252/62.9; 501/134; 501/136
[58] Field of Search .............. 501/134, 136; 252/62.9

[56] References Cited

FOREIGN PATENT DOCUMENTS

| | | | |
|---|---|---|---|
| 0219895 | 4/1987 | European Pat. Off. | |
| 2837508 | 3/1979 | Fed. Rep. of Germany | 501/134 |
| 2109584 | 5/1972 | France . | |
| 0069712 | 7/1974 | Japan | 501/134 |
| 55-151381 | 11/1980 | Japan . | |
| 60-21941 | 5/1985 | Japan . | |
| 63-151667 | 6/1988 | Japan . | |
| 0174276 | 7/1990 | Japan | 501/134 |

OTHER PUBLICATIONS

"Dielectric, Electromechanical, Optical and Mechanical Properties of Lanthanum-Modified Lead Titanate Ceramics", T. Yamamoto, Hideji Igarashi, and Kiyoshi Okazaki, Journal of the American Ceramic Society, vol. 66, No. 5, May 1983, Columbus, Ohio, USA, pp. 363-366.

Copy of European Search Report, dated Aug. 21, 1992.

*Primary Examiner*—Mark L. Bell
*Assistant Examiner*—Deborah Jones
*Attorney, Agent, or Firm*—Finnegan, Henderson, Farabow, Garrett & Dunner

[57] ABSTRACT

With lead titanate based piezoelectric ceramic materials wherein the composition can be represented by $(Pb_{1-(3/2)x}A_x)(Ti_{1-y}B_y)O_3$ wherein A represents one or more elements selected from among La, Sm, Nd, Sr and Ca, B represents one or more elements selected from among Mn, Ni and Cr, and $0.02 \leq x \leq 0.06$ and $0.001 \leq y \leq 0.007$, the Curie temperature is high at 495° C., there is no pressure - electric charge output hysteresis, and the temperature stability is excellent (less than 1100 ppm/°C.).

5 Claims, 1 Drawing Sheet

LEAD TITANATE BASED PIEZOELECTRIC CERAMIC MATERIAL

BACKGROUND OF THE INVENTION

1. Field of the Invention

The present invention relates to lead titanate based piezoelectric ceramic materials having superior Curie temperature, hysteresis and pressure-electric charge output characteristics, etc., which are especially useful in the fields of pressure sensors, acceleration sensors and filters, etc.

2. Description of the Related Art

Piezoelectric materials can be used as pressure sensors or acceleration sensors, by making use of the piezoelectric effect thereof. Namely, when a pressure is applied to a piezoelectric material an electric charge is generated in accordance with the pressure (deformation), and it is possible to detect this electric charge and thereby measure the pressure or the acceleration.

Lead titanate piezoelectric materials of a composition approaching that of this present invention are disclosed in Japanese Examined Patent Publication (Kokoku) No. 60-21941, Japanese Unexamined Patent Publication (Kokai) No. 55-151381 and Japanese Unexamined Patent Publication (Kokai) No. 63-151667.

The piezoelectric materials used as pressure sensors and acceleration sensors must be such that the pressure - electric charge output is stable, and especially in environments where changes in temperature occur, the characteristics must be stable within the used temperature range.

To date, however, a piezoelectric material satisfying such conditions in a practical sense has not been obtained.

The lead titanate piezoelectric materials disclosed in the aforementioned Japanese Examined and Unexamined Patent Publications were developed principally for resonators, and consequently, the characteristics required for pressure sensors and acceleration sensors were not evaluated. For example, the piezoelectric material of Japanese Examined Patent Publication (Kokoku) No. 60-21941 has a low Curie temperature and the temperature variation of the piezoelectric characteristics is considerable, and the piezoelectric material of Japanese Unexamined Patent Publication (Kokai) No. 55-151381 is such that the hysteresis of the pressure - electric charge characteristics at high temperatures is considerable. The temperature variation of the resonance frequency is small in Japanese Unexamined Patent Publication (Kokai) No. 63-151667, but the temperature variation factor of the dielectric constant is considerable, and thus ultimately the temperature variation factor of pressure - electric charge output becomes remarkable.

The present invention is intended to provide a satisfactory piezoelectric ceramic material for use principally as a pressure sensor or acceleration sensor, under such circumstances.

SUMMARY OF THE INVENTION

To realize the above object, this present invention provides a lead titanate based on a piezoelectric material having a composition represented by $(Pb_{1-(3/2)x}A_x)(Ti_{1-y}B_y)O_3$ wherein A represents one or more element selected from among La, Sm, Nd, Sr and Ca, B represents one or more element selected from among Mn, Ni and Cr, $0.02 \leq x \leq 0.06$, and $0.001 \leq y \leq 0.007$.

DESCRIPTION OF THE PREFERRED EMBODIMENTS

Figure 1:
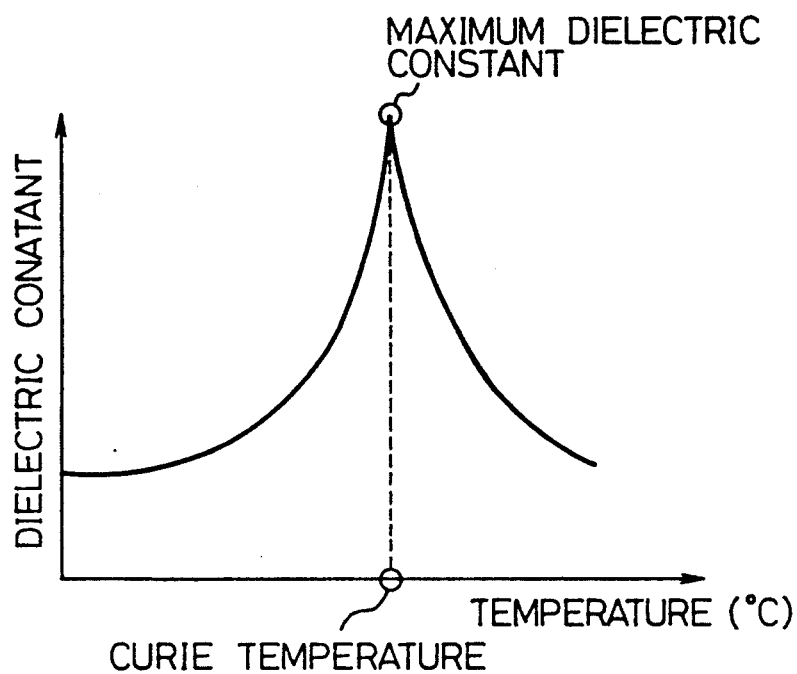
FIG. 1 is a diagram for defining the Curie temperature.

The piezoelectric ceramic material of the present invention has a structure in which part of the lead in the lead titanate is replaced by La, Sm, Nd, Sr or Ca and part of the titanium is replaced by Mn, Ni or Cr. Sintering becomes possible on replacing some of the lead with Ca etc. If the value of x, which represents the extent of this substitution, is outside the range of 0.02 to 0.06, the temperature stability of the pressure-electric charge output characteristics of the piezoelectric ceramic material becomes poor. The preferred range of x is 0.03 to 0.05, particularly 0.04.

Furthermore, polarization becomes possible and piezoelectric characteristics can be realized by replacing part of the titanium with Mn, etc. If the value of y, which represents the extent of this substitution, is outside the range of 0.001 to 0.007, the pressure - electric charge output hysteresis becomes remarkable. The preferred range of y is 0.003 to 0.007, more preferably 0.003 to 0.005, particularly 0.004.

The piezoelectric ceramic material of this present invention can be prepared by compounding raw material oxides such as $PbO$, $TiO_2$, $La_2O_3$, $M_nO$ etc., or raw materials which form oxides on baking, in the intended composition ratio and calcining or baking in an oxygen containing atmosphere.

A piezoelectric ceramic material of this present invention is made by molding a powder and sintering for use as a pressure sensor for example.

A lead titanate based piezoelectric ceramic material of this present invention is useful principally as a pressure sensor or acceleration sensor etc. in view of the excellent temperature stability of its pressure-electric charge output etc., but it can also be used as a filter for example.

A piezoelectric ceramic material in which a specified small amount of La, Sm, Nd, Sr, Ca has been added instead of the lead in the lead titanate and a specified small amount of Mn, Ni, Cr has been added instead of titanium has a high Curie temperature and no pressure - electric charge output hysteresis and excellent temperature stability and so it is used as a pressure sensor or acceleration sensor.

EXAMPLES

Materials were weighed such that x in the composition ratio in the general formula $(Pb_{1-3/2x}La_x)Ti_{1-y}Mn_y)O_3$ was 0, 0.01, 0.02, 0.04, 0.06, 0.08, 0.10, 0.15 or 0.20 and y was 0.001, 0.003, 0.005, 0.007, 0.008, 0.010, 0.015 or 0.020, and were wet mixed for 48 hours in a pot mill. After mixing, the mixture was de-watered and dried, and then calcined for 2 hours at 700°-950° C. The calcined powder was then again wet mixed for 48 hours in a pot mill, and the mixture then de-watered and dried.

Pellet-like elements were prepared, in order to evaluate the characteristics, and after adding about 3 wt % of PVA [poly(vinyl alcohol)] to the lead titanate as a binder, and forming granules, the mixture was molded into discs having a diameter of 20 mm and a thickness of 1 mm, at a molding pressure of 1 t/cm². The moldings where placed on a pad material of a mixed powder comprising 20 wt % lead monoxide and 80 wt % zirconia, placed inside an alumina bowl, covered with a lid, and baked. The baking involved baking at 1100° C.-1300° C. in an air oven, at a temperature elevation rate of 200° C./h.

The occurrence of cracks in the piezoelectric elements after baking is shown in Table 1.

pressure of 2000N was applied to the element, and is indicated in ppm/°C. The results are shown in Table 4.

It can be seen from Table 2 that, with compositions within the range of $0.02 \leq x \leq 0.06$, the Curie temperature of the element is always 495° C., and that when x exceeds 0.08, the Curie temperature falls rapidly.

It can be seen in Table 3 that the polarization is uneven (sic) with a composition in which $y=0$, and there is no hysteresis with compositions in which $0.001 \leq y \leq 0.007$, but hysteresis becomes remarkable when y is 0.008 or above.

TABLE 1

| | Occurrence of Cracks After Baking | | | | | | | | |
|---|---|---|---|---|---|---|---|---|---|
| | Y | | | | | | | | |
| x | 0 | 0.001 | 0.003 | 0.005 | 0.007 | 0.008 | 0.010 | 0.015 | 0.020 |
| 0 | Cracking occurred | Cracking occurred | Cracking occurred | Cracking occurred | Cracking occurred | Cracking occurred | Cracking occurred | Cracking occurred | Cracking occurred |
| 0.01 | Cracking occurred | Cracking occurred | Cracking occurred | Cracking occurred | Cracking occurred | Cracking occurred | Cracking occurred | Cracking occurred | Cracking occurred |
| 0.02 | | | | | No cracking occurred | | | | |
| 0.04 | | | | | | | | | |
| 0.06 | | | | | | | | | |
| 0.08 | | | | | | | | | |
| 0.10 | | | | | | | | | |
| 0.15 | | | | | | | | | |
| 0.20 | | | | | | | | | |

From Table 1 it is clear that cracking occurred in elements during baking when x was 0.01 or below, and that cracking did not occur in the other part of the range.

Next, elements obtained by fusing silver electrodes onto both sides of the elements in which cracking had not occurred were each subjected to a polarizing treatment in silicone oil for 10 minutes at 180° C., 6 kV/mm. The Curie temperature and the pressure - electric charge hysteresis at 150° were measured for the polarized elements, and the results are shown in Table 2 and Table 3 respectively.

Figure 2:
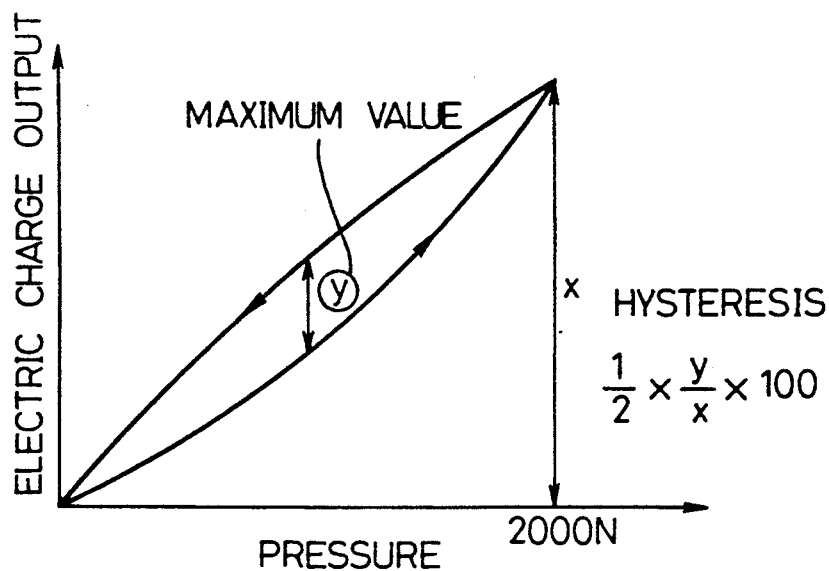
FIG. 2 is a diagram for explaining the hysteresis due to the pressure - charge output of a piezoelectric element.

The Curie temperature, as shown in FIG. 1, was obtained as the temperature at which the dielectric constant reached a maximum in respect of the temperature. Furthermore, as shown in FIG. 2, the pressure-electric charge output hysteresis was obtained as $(\frac{1}{2})(y/x) \times 100$ from the pressure difference x when the pressure was increased from 0 to 2000N, and the maximum value y of the difference in the electric charge output under the same pressure was obtained when the pressure was subsequently returned to 0.

Furthermore, the temperature variation at 30°-150° C. of the pressure - electric charge output of the polarized elements was obtained. This represents the extent of the change in the electric charge output with a change in temperature from 30° C. to 150° C., when a Moreover, in Table 4 it can be seen that, with compositions within the range of $0.02 \leq x \leq 0.06$ and $0.001 \leq y \leq 0.007$, the temperature variation factor of the pressure - electric charge output is very small (less than 1100 ppm/°C.) when compared with compositions in other ranges.

Therefore, from the results outlined above it can be concluded that lead titanate based materials of a composition within the range of $0.02 \leq x \leq 0.06$, more preferably $0.03 \leq x \leq 0.05$, $0.001 \leq y \leq 0.007$ more preferably $0.003 \leq y \leq 0.007$, have very good characteristics (Curie temperature, hysteresis, temperature variation factor) as piezoelectric materials.

TABLE 2

| | Curie Temperature | | | | | | | | |
|---|---|---|---|---|---|---|---|---|---|
| | Y | | | | | | | | |
| x | 0 | 0.001 | 0.003 | 0.005 | 0.007 | 0.008 | 0.010 | 0.015 | 0.020 |
| 0 | | | | | | | | | |
| 0.01 | | | | | | | | | |
| 0.02 | | | | | All 495° C. | | | | |
| 0.04 | | | | | | | | | |
| 0.06 | | | | | | | | | |
| 0.08 | 380° C. | 380° C. | 380° C. | 380° C. | 380° C. | 380° C. | 380° C. | 380° C. | 380° C. |
| 0.10 | 300° C. | 300° C. | 300° C. | 300° C. | 300° C. | 300° C. | 300° C. | 300° C. | 300° C. |
| 0.15 | 250° C. | 250° C. | 250° C. | 250° C. | 250° C. | 250° C. | 250° C. | 250° C. | 250° C. |
| 0.20 | 160° C. | 160° C. | 160° C. | 160° C. | 160° C. | 160° C. | 160° C. | 160° C. | 160° C. |

TABLE 3

| | Hysteresis (Temperature 150° C.) | | | | | | | | |
|---|---|---|---|---|---|---|---|---|---|
| | Y | | | | | | | | |
| x | 0 | 0.001 | 0.003 | 0.005 | 0.007 | 0.008 | 0.010 | 0.015 | 0.020 |
| 0 | | | | | | | | | |
| 0.01 | | | | | | | | | |
| 0.02 | Polarization impossible | | 0% | | | 1.2% | 2.0% | 2.4 | 3.0% |
| 0.04 | | | | | | 1.2% | 2.0% | 2.4 | 3.0% |
| 0.06 | | | | | | 1.2% | 2.0% | 2.4 | 3.0% |
| 0.08 | | | | | | 1.2% | 2.0% | 2.4 | 3.0% |
| 0.10 | | | | | | 1.2% | 2.0% | 2.4 | 3.0% |
| 0.15 | | | | | | 1.2% | 2.0% | 2.4 | 3.0% |
| 0.20 | | | | | | 1.2% | 2.0% | 2.4 | 3.0% |

TABLE 4

Temperature Variation Factor of Pressure - Electric Charge Output (Units: ppm/°C.)

| x | Y=0 | 0.001 | 0.003 | 0.005 | 0.007 | 0.008 | 0.010 | 0.015 | 0.020 |
|---|---|---|---|---|---|---|---|---|---|
| 0 | | | | | | | | | |
| 0.01 | | | | | | | | | |
| 0.02 | Polari- | 870 | 970 | 990 | 1000 | 2000 | 2200 | 2200 | 2500 |
| 0.04 | zation | 1000 | 960 | 1100 | 1030 | 2200 | 2700 | 2600 | 3000 |
| 0.06 | impos- | 1100 | 980 | 1100 | 1050 | 2500 | 3000 | 2800 | 3600 |
| 0.08 | sible | 2700 | 2800 | 2700 | 2900 | 3000 | 3200 | 3000 | 3800 |
| 0.10 | | 3300 | 3700 | 3500 | 3500 | 4000 | 3700 | 3300 | 4000 |
| 0.15 | | 3900 | 4400 | 4200 | 4200 | 4500 | 4200 | 4000 | 4400 |
| 0.20 | | 5000 | 5200 | 4700 | 4800 | 5000 | 4900 | 4600 | 4800 |

Furthermore, a lead titanate piezoelectric ceramic material of this present invention is also useful as a filter in which use of made of the fact that the impedance is reduced at a specified frequency and external signals are easily passed, and in particular, the temperature stability of this characteristic is high and is stable at high temperatures.

A lead titanate based piezoelectric ceramic material of this present invention has a high Curie temperature and no pressure - electric charge output hysteresis and further, has an excellent temperature stability, and thus is useful as a pressure sensor or an acceleration sensor.

I claim:

1. Lead titanate based piezoelectric ceramic materials wherein the composition can be represented by $(Pb_{1-(3/2)x}A_x)(Ti_{1-y}B_y)O_3$ wherein A represents one or more elements selected from the group consisting of La and Sm, B represent one or more elements selected from the group consisting of Mn, Ni and Cr, and $0.02 \leq x \leq 0.06$ and $0.001 \leq y \leq 0.007$.

2. A material according to claim 1 wherein $0.03 \leq x \leq 0.05$.

3. A material according to claim 1 wherein $0.003 \leq y \leq 0.007$.

4. A material according to claim 1 wherein $0.003 \leq y \leq 0.005$.

5. A material according to claim 1 wherein $x = 0.04$ $y = 0.004$.

* * * * *

UNITED STATES PATENT AND TRADEMARK OFFICE
CERTIFICATE OF CORRECTION

PATENT NO. : 5,254,278
DATED : October 19, 1993
INVENTOR(S) : Kaneko

It is certified that error appears in the above-indentified patent and that said Letters Patent is hereby corrected as shown below:

Claim 1, Col. 6, line 11, "represent" should read --represents--.

Claim 5, Col. 6, line 20, insert --and-- before "y=0.004."

Signed and Sealed this

Twentieth Day of September, 1994

Attest:

BRUCE LEHMAN

Attesting Officer     Commissioner of Patents and Trademarks